United States Patent
Wilson et al.

(10) Patent No.: US 6,906,539 B2
(45) Date of Patent: Jun. 14, 2005

(54) HIGH DENSITY, AREA ARRAY PROBE CARD APPARATUS

(75) Inventors: Lester Wilson, Sherman, TX (US); Reynaldo M. Rincon, Richardson, TX (US); Jerry Broz, Longmont, CO (US); Richard W. Arnold, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 294 days.

(21) Appl. No.: 09/905,426

(22) Filed: Jul. 14, 2001

(65) Prior Publication Data

US 2002/0008529 A1 Jan. 24, 2002

Related U.S. Application Data

(60) Provisional application No. 60/219,717, filed on Jul. 19, 2000.

(51) Int. Cl.[7] ............................................. G01R 31/02
(52) U.S. Cl. ........................................ 324/754; 324/755
(58) Field of Search ................................. 324/754, 755, 324/757, 758, 765, 158.1; 439/66–67, 70

(56) References Cited

U.S. PATENT DOCUMENTS 4,885,126 A * 12/1989 Polonio ...................... 361/757

* cited by examiner

*Primary Examiner*—David Zarneke
*Assistant Examiner*—Russell M. Kobert
(74) *Attorney, Agent, or Firm*—Yingsheng Tung; Wade James Brady, III; Frederick J. Telecky, Jr.

(57) ABSTRACT

A probe card apparatus comprising a rigid substrate having thermal expansion characteristics near that of silicon, laminated with a flex film having laser patterned leads and contact pads, and contact elements comprising noble metals protruding from two major surfaces, the first mirroring the closely spaced chip pads, and the second aligned to the more generously spaced probe card pads, providing an accurate and reproducible, low cost, rapidly fabricated probe contact device, capable of contacting very high density bond pads in either area array or perimeter locations, of being electrically optimized, and readily maintained.

18 Claims, 3 Drawing Sheets

HIGH DENSITY, AREA ARRAY PROBE CARD APPARATUS

This application claims the benefit of the filing date of an earlier-filed provisional application No. 60/219,717 filed on Jul. 19, 2000.

FIELD OF THE INVENTION

This invention relates to testing of integrated circuits, and more particularly to probe card apparatus for testing of the integrated circuits.

DESCRIPTION OF PRIOR ART

Integrated circuits (ICs) are formed as multiple, identical, discrete chips on a semiconductor crystal wafer. Each of the integrated circuit chips is usually tested to determine whether or not it functions as intended prior to cutting the wafer into individual chips. Typically, the chips are tested by computer operated test apparatus that exercises the circuits on the chips, using a testing process commonly referred to as multiprobe testing.

Conventional multiprobe testing employs a probe card which includes a plurality of electrical leads terminating in needles, which in turn make contact with input/output contacts of the various circuit elements on the integrated circuit chip being tested. The chip contacts most often are the pads to be electrically connected to the next level of circuitry, and are called bond pads. In the prior art, it is typical for probe cards to be built by attaching metal needles, such as tungsten to conductive traces on a polymeric ring. The needles or probe elements may be secured to the ring by an adhesive or they may be bonded, as by welding to a blade. An opening is provided in the center of the ring for the needles to extend through, and for aligning the needles to the bond pads. The card is positioned in a probe head which provides electrical connection to the controlling computer, and which is mechanically brings the needles into contact with the bond pads on the chip.

The needles must all fall in the same place in order to assure that each one makes electrical contact with a contact or bond pad on the integrated circuit. This is accomplished by bending the needles after they are mounted on the probe card, which is laborious, time consuming, and expensive. Even after such adjustment, the needles creep back into their original positions, or are moved by pressure of the needles against the chips resulting largely from a scrubbing action used to assure penetration of any oxide coating or contamination on the bond pads.

However, the close spacing necessary for testing some chips cannot be achieved with conventional needle contacts. In particular, needle contact probe cards are nearly impossible for high density, area array bond pads on ICs. Area array refers to a plurality of bond pads positioned both around the chip perimeter, as well as arrayed inboard of the perimeter in multiple rows or columns. The tight pitch of probe needles and the angles of their projection are extremely difficult to manufacture, and in turn insures a high cost. Further, maintenance of such cards adds significantly to the cycle time of testing. As a result of these issues, a number of attempts have been made to provide alternate probe card technology. Much of the newer technology often centers around photolithographically defined conductor leads on polymeric membranes with plated or spring loaded contact mechanisms. Each of these approaches must have a means for applying uniform pressure to cause the membrane to make uniform contact across the chip. The issue of uniform contact, as well as alignment is aggravated by thermal expansion of the membrane because very often the chip generates a significant amount of heat during the testing procedure. Further, photolithography definition of the leads adds cost to the testing procedure, not only as a result of the initial cost and multiple steps involved, but also because new artwork and masks are required for each new device and/or change, thus adding to cycle time for production.

Thin film conductors have an added risk of increased inductance to the circuit, which is a significant issue for testing high speed devices. On the other hand, high resistivity of some probe needles, conductor traces, and multiple connections between needles, conductors on the probe card and those to the probe head can also lead to inductance values which impact the accuracy of chip testing.

Because of the aforementioned issues with prior probe card technologies, and because of the anticipation of even tighter pitch of bond pads on integrated circuits of the future, it would be very advantageous to the industry to have a low cost probe contact apparatus, having a rapid means of fabrication, modification, or repair, having low inductance, and very high density of contacts capable of being configured for area array integrated circuit testing.

SUMMARY OF THE INVENTION

It is an object of the current invention to provide a probe card apparatus capable of making electrical contact to a very high density of chip input/output contact pads positioned in either an area array, and/or on the perimeter, and to a probe card and integrated circuit (IC) tester.

It is another object of the invention to provide a probe card contact apparatus which can be manufactured rapidly and economically.

It is yet another object of the invention to provide a probe card apparatus having thermal expansion similar to that of the semiconductor device to be tested so that contact is not compromised as a result of chip heating during testing.

It is an object of the invention to provide a probe card contact apparatus which is connected to a probe card of current fabrication technology.

Yet another object of the current invention is to provide a high performance probe card contact apparatus.

The objectives of this invention are met by providing a thermally stable, flexible dielectric film with a plurality of conductive metal leads and contacts, wrapped around and secured to a formed, rigid, low coefficient of thermal expansion substrate, preferably of ceramic. The contacts on one end mirror the input/output pads on a chip to be tested, and those on the opposite end mate to an electrical contact on a probe card.

The leads are fanned from the tightly spaced chip or inner contacts to the more generously spaced outer contacts which connect to a probe card. The design of a particular IC's input/output pads is input to a computer controlled laser. The fine beam of current technology lasers easily meets the tight pitch requirements of area array pads both in current production and in plans for the future. By use of a highly conductive, somewhat ductile metal, such as tin, and/or copper and tin, low inductance leads may be etched in a dense pattern by a fine beam laser. The conductors and pads have a thin, electroless plating of a noble metal, such as gold to provide environmental protection, and a bondable surface.

A raised contact element, such as a stud bump or microwire of a noble metal is mated to both the chip contact pads, as well as to the outer pads for probe card connection. These protruding contact elements may be bonded by a wire bonder, such as that used for attaching wires an integrated circuit bond pad and connecting to the next level of interconnection.

The non-metallized surface of the flexible film is mated to and adhered to the rigid substrate. Each quadrant of the film is pulled tightly around the sides of the substrate and adhered to the opposite side of the substrate. Outer contact pads, now exposed on the second surface of the substrate are in position to make intimate contact with a probe card, such as the polymer based cards typically used throughout the industry. The rigid substrate with contacts on both sides, one to the chip and the other to probe card connections is positioned in a probe card, and that assemblage is capable of being brought into and held in intimate contact with the chip contact pads. The low expansion substrates supports the contacts elements and tolerates little change in position during testing.

High resolution, ease and low cost of fabrication, and pattern customizing are achieved by software input of the design into a fine beam laser which ablates excess metal from a metal coated film. Rapid response cycle time is achieved by inventory of a substrates, and unpatterned metallized film. Laser processing is a significant factor in the ability to respond rapidly to the need for new probe cards designs, and the manufacture of high performance, high density probe card apparatus.

The foregoing and other objectives, features and advantages will become more apparent from the following detailed description of preferred embodiments of the invention which proceed with reference to the accompanying drawings.

DETAILED DESCRIPTION OF THE INVENTION

Figure 1A:
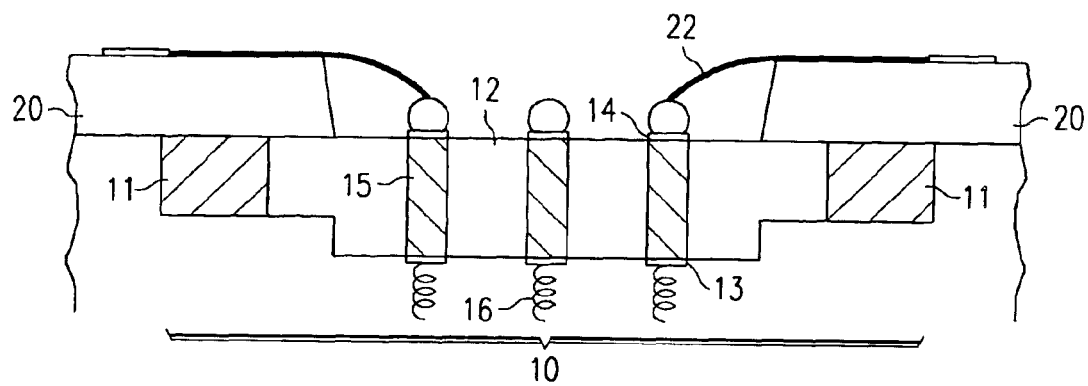
FIG. 1a is a cross section of a flex film on a ceramic probe contact apparatus affixed to a probe card with needle contact between the apparatus and card.
Figure 1B:
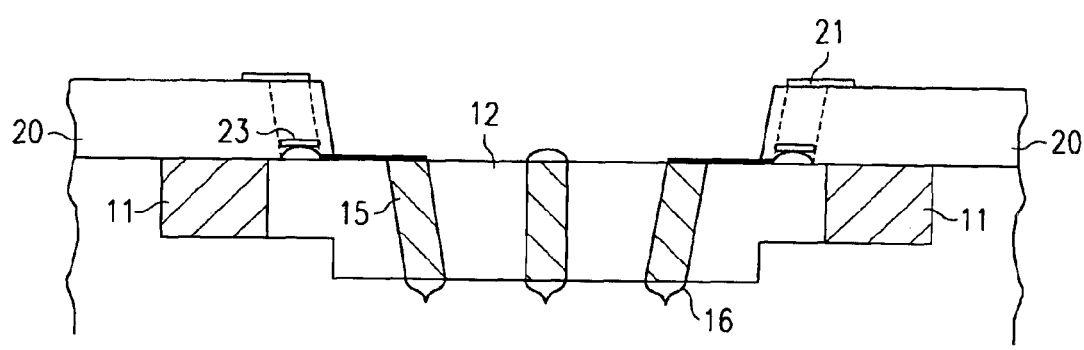
FIG. 1b is a cross section of a flex film on a ceramic probe contact apparatus contacted to a probe card by connections on the underside of the card.
Figure 2:
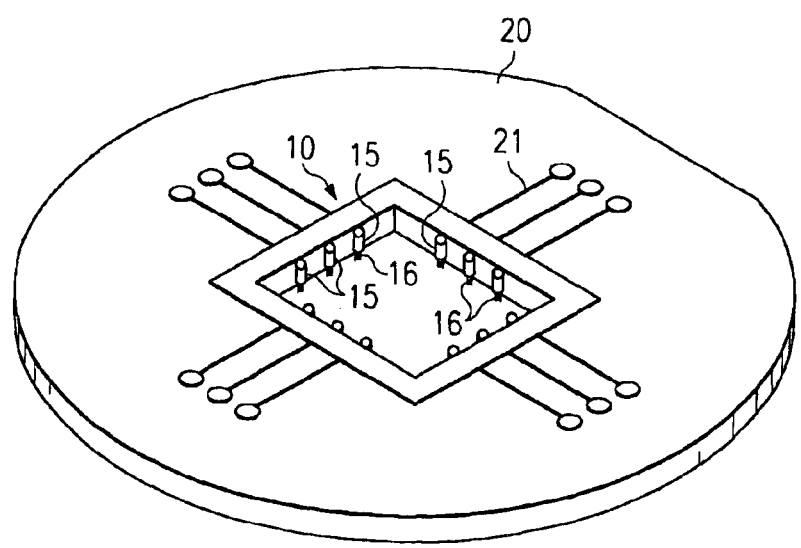
FIG. 2 is a top down view of a flex film on ceramic probe contact apparatus positioned in a probe card.

FIGS. 1a and 1b are cross sections of,the probe contact apparatus 10 of the current invention positioned in a probe card 20. FIG. 2 is a top view of the probe card 20 with the probe contact apparatus 10 only partially visible. In FIG. 1a, a cross section of an embodiment of the probe apparatus 10 includes a rigid substrate 11, a flexible dielectric film 12 extending from the first surface of the substrate around the edges and onto the second surface, and a plurality of contact pads 13, 14 on each end of conductive leads 15 formed on the film. Attached to the fine pitch contacts 13 on the first surface of the apparatus are protruding contact elements 16. These contact elements 16 are positioned to mirror the input/output pads of an integrated circuit under test (not shown). The position of contact pads 14 on the second surface corresponds to terminals of a probe card. In FIG. 1a, the terminals of the probe card are needle type probes 22. Alternately in FIG. 1b, contact is made near the perimeter by a contact 23 on the under-side of the probe card.

FIG. 2 illustrates a probe card 20 with conductor traces 21. The probe contact apparatus 10 of the current invention is positioned on the underside of the probe card. Chip contact elements 16 extend below the card assemblage, and may be brought into contact with chip pads by positioning and lowering the card and contact apparatus assemblage.

Figure 3:
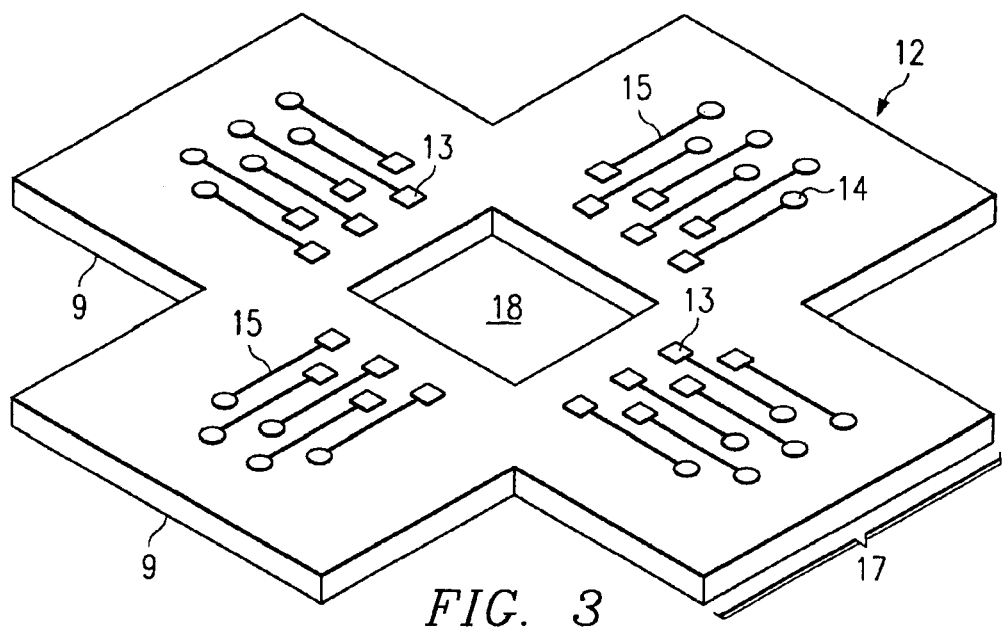
FIG. 3 illustrates a flexible film with probe contact conductor patterns.
Figure 4:
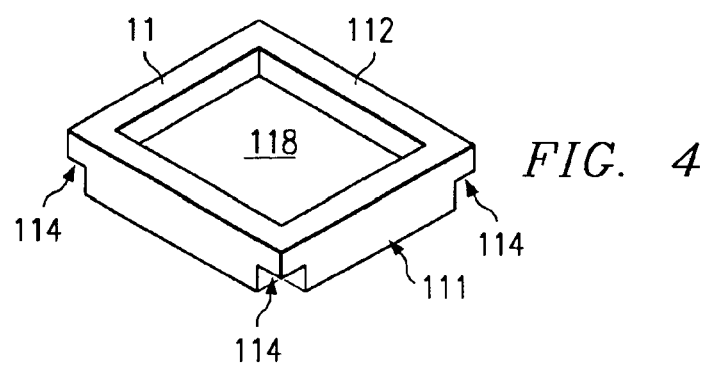
FIG. 4 is a ceramic substrate.

To explain further the probe apparatus, two of the components are illustrated in FIGS. 3 and 4. FIG. 3 shows a dielectric film structure 12 having a plurality of conductive leads 15, with pads 13, 14 defined on the first surface of the film. The dielectric film comprises a thermally stable polymer, such as those of the polyimide family, in the range of 0.0005 to 0.0025 inches thick.

A layer of a highly conductive, ductile metal affixed to the film has been etched using a fine beam laser to form a plurality of leads 15 with contacts 13, 14. The lead and contact patterns are programmed into the laser control system using the precise design of chip bond pads. Metallization is preferably a layer of tin, tin over copper, or other low resistivity metals affixed by lamination, or vapor deposition over the first surface of the flex film. Subsequent to patterning leads and contacts, a thin film of a noble metal, preferably gold, is plated to cover the metal conductors.

The film is preferably processed in strip form through the metallization, laser etching, and plating processes prior to cutting or stamping into individual structures. Each structure includes preferably a central aperture 18, and multiple wing shaped sections 17, surrounding the intact mid-section of the film. In one embodiment, a thin layer of adhesive 9 covers the second, unmetallized surface of the dielectric film. In an alternate embodiment, an adhesive coats the substrate in those locations where a flex film will be affixed.

FIG. 4 illustrates a substrate 11 preferably comprising a ceramic material having a coefficient of thermal expansion in the range of 2 to 10 PPM, and thickness in the range of about 0.040 to 0.250 inches. Thickness of the substrate is a function of the tester fixturing, and is thick enough to allow the protruding contacts to make intimate contact with the chip input/output pads. Preferably, the substrate will include a centrally located aperture 118 to allow course visual alignment of contacts on the apparatus to bond pads on the chip, and a means of viewing the testing procedure. The aperture is sized to be smaller than the innermost array of bond pads on the chip to be tested. In an alternate embodiment, the aperture is eliminated, and viewing of the probes is made by microscopes with vision in both the up and down directions.

In one embodiment a notch 114 is positioned at each of the four corners. The notched corners 114 of the substrate provide a position for clamping the substrate into an opening of a probe card. The need for notched corners, and the specific design of said notches is based on the test probe fixturing, and is not critical to the functionality of the apparatus.

The invention envisions a series of substrates of predetermined dimensions which correlate to probe card contacts and fixturing. The specific substrate is selected based approximately on the chip size to be tested, and in general is a minimum of about twice the chip size, thereby allowing fan out of the contact pads 14 from the chip contact pads 13.

Figure 5:
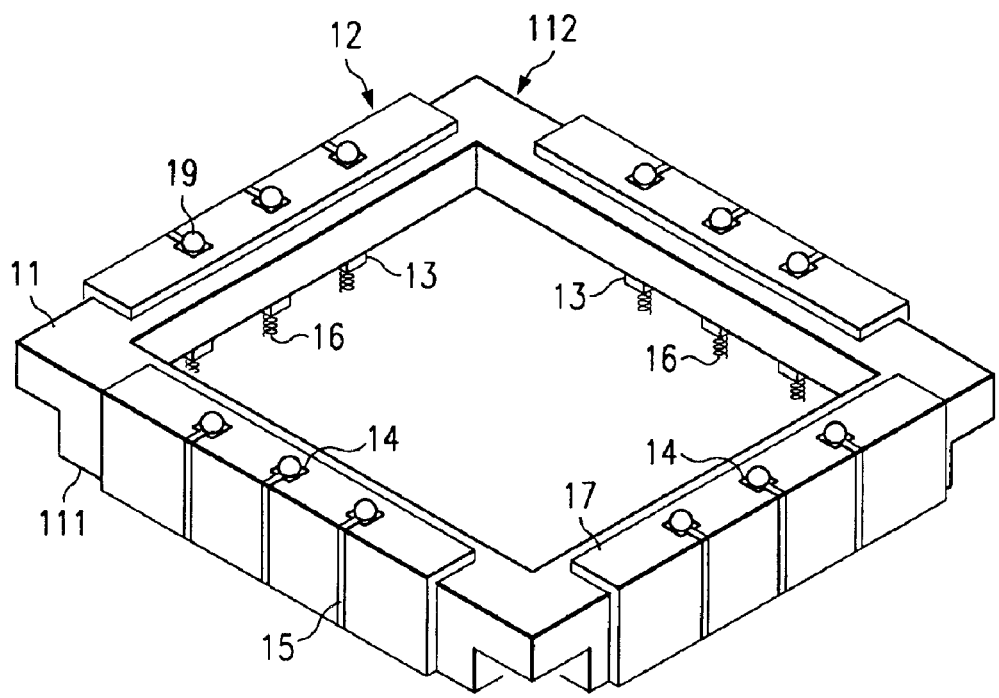
FIG. 5 is an assembled flex film on ceramic probe card apparatus of the current invention.

FIG. 5 illustrates the flexible film 12 with leads 15 and contacts assembled onto the substrate 11. The second surface of the flexible film has been aligned to the first surface 111 of the substrate, and each of the wings 17 of the film wrapped around the edge and onto the second surface 112 of the substrate 11. Having wrapped the non-patterned surface of the film around the outer edges of the substrate, the leads 15, and contact pads 13 and 14 are exposed, so that the contact pads 14 are positioned on the second surface 112 of the substrate and the contact pads 13 are located on the first surface 111. The contact pads 14 with an interconnection means 19 are located so that they correspond to electrical contacts and traces on a probe card. Contact pads 13 with protruding contact elements 16 are positioned to be in alignment with bond pads on an IC.

Prior to adhering the flex film to the substrate, noble metal contact elements, formed as microspring wires 16, stud bumps 19, or other types of metallic protrusions are bonded to contact pads 13 and 14 by mechanical, or ultrasonic bonding equipment, similar as that used for wire bonding semiconductor devices. Use of noble metal probes has been shown to minimizes the amount of scrubbing or over-travel required to break oxides on the aluminum or copper bond pads and make excellent electrical contact. See Broz, J. J., et al., "Probe Contact Resistance Variations During Elevated Temperature Test" *Proceedings of IEEE—International Test Conference* 1999, Atlantic City, N.J. pp396–405.

Figure 6:
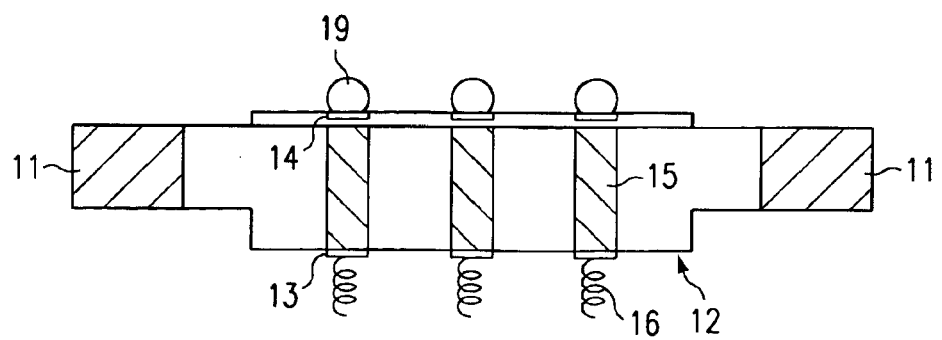
FIG. 6 is a cross section through an assembled probe apparatus, including protruding contact elements.

In a cross sectional view in FIG. 6, the apparatus is illustrated with stud bumps 14 on one set of pads, and micro-spring elements on the other set 13. However, it is expected that the same elements will be used for both sets. Microspring wires technology is commercially available from Precision Art Coordinators, 22 Almeida Avenue, East Providence, R.I. 02914. Stud bumping is a term applied to a ball formed by a wire bonder, wherein the ball is welded to a pad, the wire removed, and the remaining protrusion coined or otherwise partially flattened to control the ball "z" dimension. This technology is known in the industry and has been used for a variety of applications, including bumps on chip bond pads.

Figure 7:
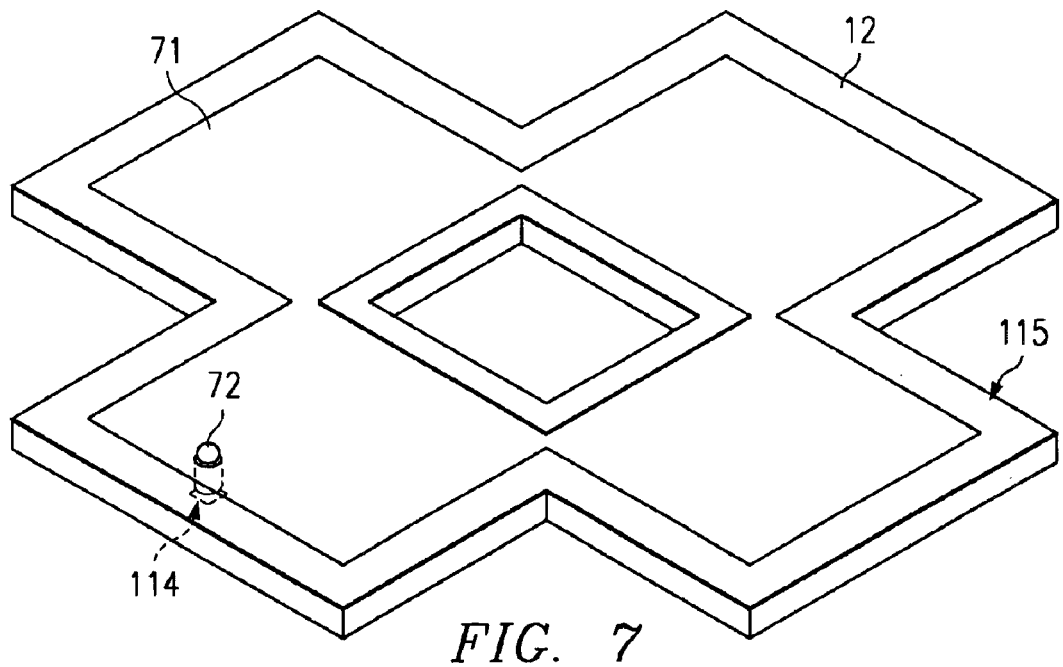
FIG. 7 illustrates a ground ring patterned on the second surface of a flexible film.

A high performance embodiments of the probe contact apparatus include customized leads wherein the lead dimensions are designed to provide or approach a specific impedance level. Further optimization of the impedance level can be achieved by providing a ground plane on the film structure. FIG. 7 illustrates a patterned ground ring 71 on the second surface 115 of a flex film structure 12. Metallization, patterning and etching are achieved in the same manner as the leads and pads on the first surface 114. A metal filled via 72 provides connection between the ground plane and a lead on the first surface.

The flex film on rigid substrate probe card apparatus of the current invention provides a number of innovative advantage to the semiconductor industry. The method of manufacture lends itself to relatively low cost and rapid cycle time, necessary to respond to the fast paced introduction of chip designs for both new and revised products.

Components for the apparatus are largely prefabricated and held in inventory. Ceramic substrates are provided in a range of sizes, and shapes related to chip size and tester fixturing. Unpatterned, metallized flex film preferably in tape and reel format, or as individual piece parts are prefabricated.

Software input of the critical pad location and dimensions are based precisely on that of the chip design. Probe card pad positions, and in some embodiments, customized impedance constraints are input into the design.

The software generated pattern is input to a computer controlled laser for etching the metallized flex film, and can be accomplished within a matter of minutes. Unwanted metal is ablated using a fine beam laser, resulting in a pattern of leads and pads. Current technology provides a laser having beam resolution of as small as 30 microns, more than adequate for tight pitch input/output pads of IC devices. Tin is readily ablated by laser, and if tin over copper is the metallization of choice, the pattern is laser etched in the tin and the copper chemically etched using the tin as a mask. The patterned film is plated with a flash of gold by electroless plating to protect the less noble metals from environmental damage and to provide a surface for bonding.

While laser ablation of unwanted metallization is the preferred method of forming a pattern, any of a number of alternatives are available in the industry, including photolithography of thin film metallization and plating to a required thickness.

Contact elements, such as alloys of noble metals, formed as microspring wires 16, stud bumps 19, or other types of metallic protrusions are bonded to contact pads 13 and 14 by mechanical, or ultrasonic bonding equipment, similar as that used for wire bonding semiconductor devices.

The substrate is coated with a thermally activated adhesive, or alternately an adhesive is laminated onto the backside prior to mechanically stamping individual flex film components, as illustrated in FIG. 3.

The film is positioned onto the first surface of the ceramic substrate by centering the film to the opening in the ceramic, and wrapped tightly around each side of the substrate and onto the opposite surface. As a result of the flex film wrapped around a low CTE substrate, the closely spaced chip contact pads with protrusions are positioned on the first surface of the assemblage, and the contacts to be interfaced with the probe card are located on the second surface.

The probe contact apparatus of the current invention is aligned to and fitted into a probe card provided from existing technology. Low expansion substrate minimizes movement of the contacts bumps during testing as a result of chip heating. The use of noble metal contacts has been shown to minimizes the amount of scrubbing or over-travel required to break oxides on the aluminum bond pads, to avoid oxidation of the probes, and to make excellent electrical contact. Application of ultrasonic energy has been shown to assist in removing oxides or contamination without the need for excessive x-y motion, and therefore minimizes damage to thin, fragile bond pads on ICs, see Ser. No. 09/443033, filed Nov. 18, 1999 with U.S. patent Office which is incorporated herein by reference.

The probe card apparatus of the current invention, comprising a rigid substrate having thermal expansion characteristics near that of silicon, laminated with a flex film having laser patterned leads and contact pads, and noble metal contact elements protruding from two major surfaces, the first mirroring the closely spaced chip pads, and the second aligned to the more generously spaced probe card pads provides an accurate and reproducable, low cost, rapidly fabricated probe contact device, capable of being electrically optimized, as well as ease of use and maintenance.

While the invention has been described with reference to specific embodiments, but it is not intended to limit the scope to a particular form set forth, but on the contrary, it is intended to cover alternatives, modifications, and equivalents as may be included within the spirit of the invention as described by the appended claims.

What is claimed is:

1. A probing card contact apparatus, including:
   a substrate formed of a material of which the coefficient of thermal expansion is similar to that of a semiconductor wafer, having a first major surface, and a second major surface, and outer edge surfaces;
   a flexible dielectric film patterned on one of said surfaces to form a plurality of electrically conductive leads terminated in contact pads on both ends,
   said dielectric film adhered to the substrate, and wrapped around the outer edges, such that the contact pads on one end of the leads are positioned on the first major surface of the substrate and those on the opposite end are positioned on the second major surface, and
   a contact element protrusion affixed to each of said contact pads.

2. An apparatus as in claim 1 wherein the substrate has a coefficient of thermal expansion in the range of 2 to 10 PPM.

3. An apparatus as in claim 1 wherein said substrate comprises a ceramic.

4. An apparatus as in claim 1 having an opening in the center.

5. An apparatus as in claim 1 wherein said dielectric film comprises a polymer.

6. An apparatus as in claim 1 wherein said dielectric film is in the range of 0.005 to 0.03 inches thick.

7. An apparatus as in claim 1 wherein said leads and pads comprise a first layer of copper and second layer of tin.

8. An apparatus as in claim 1 wherein said leads and pads comprise tin.

9. An apparatus as in claim 1 wherein said conductive leads are ductile.

10. An apparatus as in claim 1 wherein said contact pads on the first surface mirror input/output pads on an integrated circuit to be tested.

11. An apparatus as in claim 1 wherein said contact pads on the second surface mirror electrical contacts on a probe card.

12. An apparatus as in claim 1 wherein said contact element protrusions comprise a noble metal.

13. An apparatus as in claim 1 wherein said contact elements are stud bumps.

14. An apparatus as in claim 1 wherein said contact elements are microwires.

15. An apparatus as in claim 1 wherein said contact pads and elements are arrayed placed in an area array.

16. An apparatus as in claim 1 wherein said contact pads and elements are spaced more closely on the first surface than on the second surface.

17. An apparatus as in claim 1 wherein the inductance of said leads is customized.

18. An apparatus as in claim 1 where in a ground plane is patterned on the second surface of said flexible film.

* * * * *